United States Patent
Shimizu (10) Patent No.: US 8,773,000 B2
(45) Date of Patent: Jul. 8, 2014

(54) ACOUSTIC WAVE DEVICE

(75) Inventor: Yohei Shimizu, Kanagawa (JP)

(73) Assignee: Taiyo Yuden Co., Ltd., Tokyo (JP)

(*) Notice: Subject to any disclaimer, the term of this patent is extended or adjusted under 35 U.S.C. 154(b) by 374 days.

(21) Appl. No.: 13/286,530

(22) Filed: Nov. 1, 2011

(65) Prior Publication Data

US 2012/0119849 A1 May 17, 2012

(30) Foreign Application Priority Data

Nov. 12, 2010 (JP) ................................. 2010-253860

(51) Int. Cl.
  *H03H 3/08* (2006.01)
  *H03H 9/02* (2006.01)
  *H03H 9/00* (2006.01)
  *H03H 9/145* (2006.01)

(52) U.S. Cl.
  CPC ......... *H03H 9/0057* (2013.01); *H03H 9/02913* (2013.01); *H03H 9/02574* (2013.01); *H03H 3/08* (2013.01); *H03H 9/14588* (2013.01); *H03H 9/02559* (2013.01)
  USPC ............... 310/313 A; 310/313 R; 310/313 B; 310/313 C; 310/313 D (58) Field of Classification Search
  CPC ..... H03H 9/059; H03H 3/08; H03H 9/02574; H03H 9/02559; H03H 9/14505; H03H 9/14547; H03H 9/1452; H03H 9/6433; G06G 7/195
  USPC ....... 310/313 R, 313 A, 313 B, 313 C, 313 D
  See application file for complete search history.

(56) References Cited

U.S. PATENT DOCUMENTS

| | | | |
|---|---|---|---|
| 7,208,859 B2* | 4/2007 | Miura et al. | 310/313 R |
| 7,772,742 B2* | 8/2010 | Kando | 310/313 A |
| 7,800,464 B2* | 9/2010 | Tajima et al. | 333/193 |
| 7,855,619 B2* | 12/2010 | Takayama et al. | 333/193 |
| 2004/0135650 A1* | 7/2004 | Miura et al. | 333/133 |
| 2004/0226162 A1 | 11/2004 | Miura et al. | |
| 2005/0194864 A1* | 9/2005 | Miura et al. | 310/313 R |
| 2008/0125662 A1* | 5/2008 | Aikawa et al. | 600/463 |
| 2008/0252394 A1* | 10/2008 | Tajima et al. | 333/133 |
| 2010/0244631 A1 | 9/2010 | Kobayashi et al. | |

FOREIGN PATENT DOCUMENTS

| | | |
|---|---|---|
| JP | 2002-9584 A | 1/2002 |
| JP | 2004-186868 A | 7/2004 |
| JP | 2004-343359 A | 12/2004 |
| JP | 2010-153961 A | 7/2010 |
| JP | 2010-232725 A | 10/2010 |

OTHER PUBLICATIONS

Japanese Office Action dated Apr. 15, 2014, in a counterpart Japanese patent application No. 2010-253860.

* cited by examiner

*Primary Examiner* — Derek Rosenau
*Assistant Examiner* — Bryan Gordon
(74) *Attorney, Agent, or Firm* — Chen Yoshimura LLP (57) ABSTRACT

An acoustic wave device includes a supporting substrate made of lithium tantalate, an element substrate made of lithium tantalate, and having a lower surface bonded to and arranged on an upper surface of the supporting substrate, and a comb-like electrode formed on an upper surface of the element substrate and exciting an acoustic wave. A propagation direction of the acoustic wave in the element substrate is an X-axis of the acoustic wave. A normal direction of the upper surface of the supporting substrate is an X-axis or a Y-axis of the supporting substrate. The propagation direction of the acoustic wave is not parallel to a Z-axis of the supporting substrate.

7 Claims, 12 Drawing Sheets

ACOUSTIC WAVE DEVICE

CROSS-REFERENCE TO RELATED APPLICATION

This application is based upon and claims the benefit of priority of the prior Japanese Patent Application No. 2010-253860, filed on Nov. 12, 2010, the entire contents of which are incorporated herein by reference.

FIELD

A certain aspect of the present invention relates to acoustic wave devices.

BACKGROUND

There is known a surface acoustic wave device as an example of acoustic wave devices using acoustic waves. The surface acoustic wave device is equipped with a comb-like electrode formed on a surface of a piezoelectric substrate. The comb-like electrode is composed of a metal strip that excites, receives, resonates, or reflects the surface acoustic wave. The surface acoustic wave device has a small size and a light weight and is capable of greatly attenuating signals outside a given frequency passband. Thus, the device is used as a filter installed into a wireless apparatus such as a cellular phone terminal.

The advancements in high performance of cellular phones require an improvement in the temperature characteristic of the surface acoustic wave device and a reduction in the temperature dependence of the passband frequencies of the filter and/or a resonance frequency of a resonator. However, a piezoelectric single-crystal material having a large electromechanical coupling factor such as lithium tantalate ($LiTaO_3$) lacks temperature stability.

Japanese Patent Application Publication No. 2004-343359 describes a technique for bonding a lithium tantalate substrate, as an element substrate on which an surface acoustic wave element is formed, on a supporting substrate composed of a sapphire substrate. Japanese Patent Application Publication No. 2002-9584 describes the following. The supporting substrate and the element substrate are formed by lithium tantalate substrates. The X-axis of the element substrate is se to the propagation direction of the acoustic wave of the surface acoustic wave element. The Z-axis of the element substrate is set to the axial direction of the supporting substrate parallel to the propagation direction of the acoustic wave.

It is to be noted that, however, in the technique described in Japanese Patent Application Publication No. 2004-343359, a bulk wave may be reflected on a boundary face between the sapphire substrate and the lithium tantalate substrate, leading to an occurrence of a spurious response. This results from a difference in acoustic impedance between the sapphire substrate and the lithium tantalate substrate. The acoustic impedance depends on the acoustic velocity in each substrate and the substrate density. The technique described in Japanese Patent Application Publication No. 2002-9584 has a problem due to a large deference in linear thermal expansion coefficient between the supporting substrate and the element substrate in the propagation direction of the acoustic wave. The large difference results in thermal stress, which may deform the substrates. Paragraph 0008 of the above Patent Document describes bonding between the supporting substrate and the element substrate by Van der Waals force. Thus, the influence of the supporting substrate makes it difficult to suppress the temperature dependence of the surface acoustic wave element formed on the element substrate. A heat treatment is performed at 250° C. as described in paragraph 0009 of the above Patent Document in order to further strengthen the bonding between the supporting substrate and the element substrate. This treatment may greatly deform the substrates depending on the difference between the linear thermal expansion coefficients in the X-axis and Z-axis directions. The setting of the Z-axis parallel to the propagation direction of the acoustic wave as described in Japanese Patent Application Publication No. 2002-9584 may greatly increase the difference between the linear thermal expansion coefficients. Thus, the heat treatment for forming the acoustic surface wave element on the element substrate may deform and warp the substrates. In a case where the acoustic surface wave element is formed with the substrate being deformed, the acoustic surface wave elements formed on the substrate may not have uniform characteristics.

SUMMARY OF THE INVENTION

According to an aspect of the present invention, there is provided an acoustic wave device including: a supporting substrate made of lithium tantalate; an element substrate made of lithium tantalate, and having a lower surface bonded to and arranged on an upper surface of the supporting substrate; and a comb-like electrode formed on an upper surface of the element substrate and exciting an acoustic wave, wherein a propagation direction of the acoustic wave in the element substrate is an X-axis of the acoustic wave, a normal direction of the upper surface of the supporting substrate is an X-axis or a Y-axis of the supporting substrate, and the propagation direction of the acoustic wave is not parallel to a Z-axis of the supporting substrate.

DETAILED DESCRIPTION

A description will now be given of configurations of acoustic wave devices and methods for producing the same according to embodiments with reference to the accompanying drawings.

First Embodiment

Figure 1:
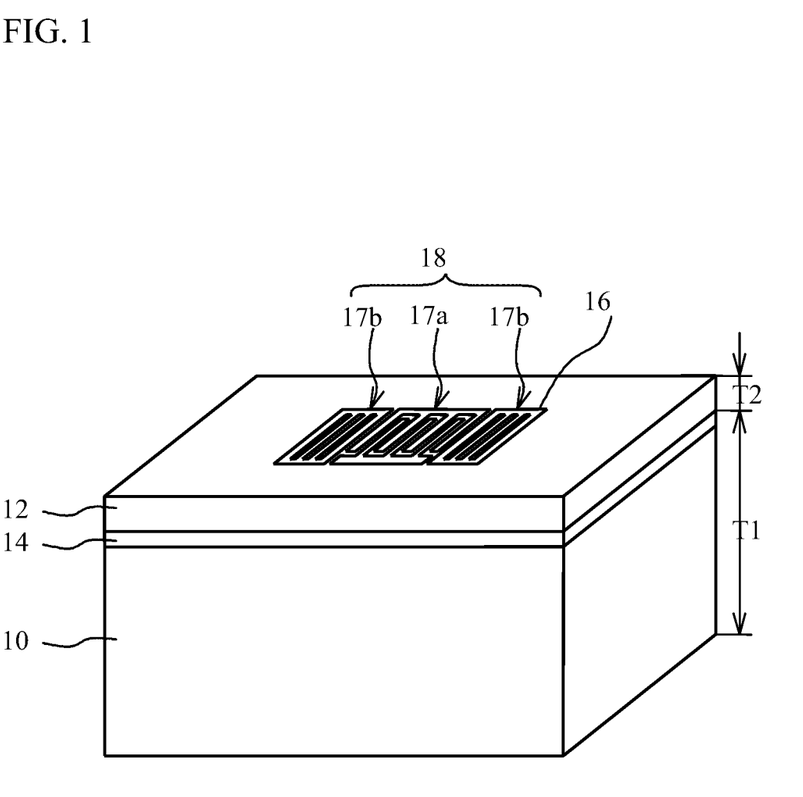
FIG. 1 is a schematically perspective view of an appearance of an acoustic wave device according to a first embodiment.

FIG. 1 illustrates an acoustic wave device according to a first embodiment. Referring to FIG. 1, the acoustic wave device according to the present embodiment includes a supporting substrate 10 having a film thickness T1, and an element substrate 12 having a film thickness T2 and a lower surface bonded to and arranged on an upper surface of the supporting substrate 10. The supporting substrate 10 and the element substrate 12 are made of lithium tantalate (LiTaO$_3$). An amorphous layer 14 is interposed between the upper surface of the supporting substrate 10 and the lower surface of the element substrate 12. The amorphous layer 14 is very thin as compared with the thicknesses T1 and T2. However, FIG. 1 emphasizes the thickness of the amorphous layer 14 for the sake of convenience.

A one-port resonance element 18 as an acoustic wave surface element is formed on the upper surface of the element substrate 12. The one-port resonance element 18 has an interdigital transducer (IDT) 17a and reflection electrodes 17b, which are formed by a patterned metal layer 16 formed on the element substrate 12 and made of Al (aluminum). The IDT 17a has two comb-like electrodes. On the contrary, the reflection electrodes 17b are arranged at both sides of the IDT 17a, respectively. The comb-like electrodes of the IDT 17a excite acoustic waves. The excited acoustic waves are by the reflection electrodes 17b. The acoustic wave propagation direction is the X-axis direction of the element substrate 12. It is to be noted that the exemplary one-port resonance element 18 is described as an acoustic wave element having a comb-like electrode. The acoustic wave element corresponds to a ladder-type filter and a multimode filter including a plurality of resonant elements.

Figure 2A:
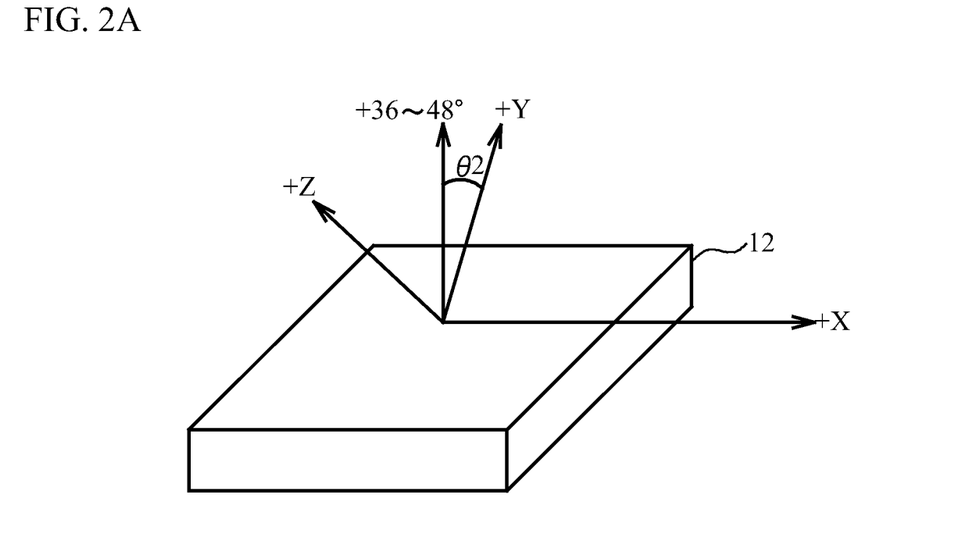
FIGS. 2A and 2B are views of crystal orientations of an element substrate and a supporting substrate, respectively.
Figure 2B:
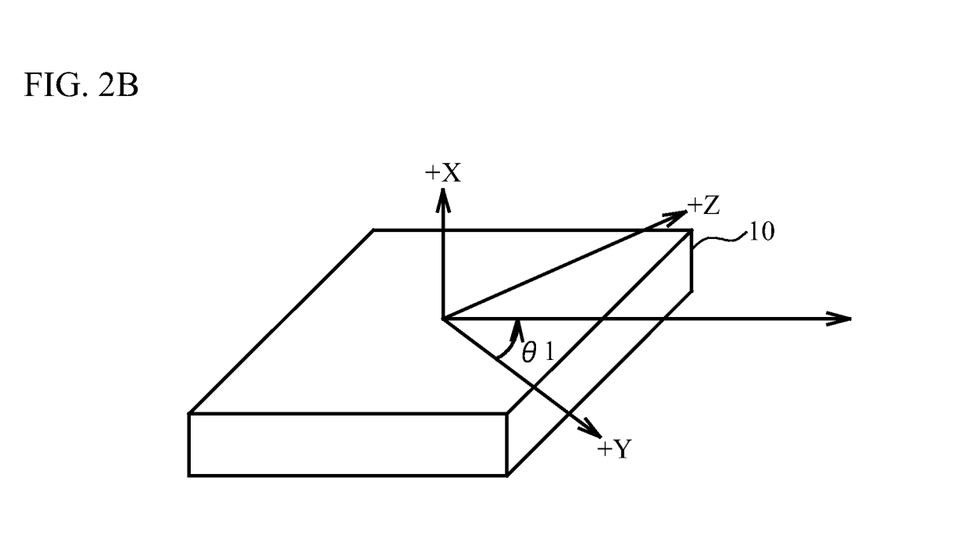

FIG. 2 illustrates crystal orientations of the element substrate 12 and the supporting substrate 10 in the acoustic wave device according to the first embodiment. As illustrated in FIG. 2A, the acoustic wave propagation direction of the element substrate 12 is the X-axis direction, and a normal direction of the upper surface is a direction rotated by an angle θ2 from the Y-axis toward the Z-axis with the X-axis being as a center. This is referred to as θ2 degree Y-cut X-propagation lithium tantalate substrate. As illustrated in FIG. 2B, the normal direction of the upper surface of the supporting substrate 10 is the X-axis, and a direction parallel to the propagation direction of the acoustic wave is a direction rotated by θ1 degree from the Y-axis toward the Z-axis with the X-axis being as a center. This is referred to as an X-cut θ1 degree lithium tantalate substrate.

FIGS. 3A through 3E illustrate a method for producing the acoustic wave device according to the first embodiment. First, a metal film 20 is formed on the lower surface of the supporting substrate 10 made of lithium tantalate (LiTaO3) having a wafer shape, and a metal film 22 is formed on the upper surface of the element substrate 12 made of lithium tantalate (LiTaO3) in a similar manner (see FIG. 3A). The metal films 20 and 22 are used as conductive films to fix the substrates on an electrostatic chuck stage of a substrate bonding apparatus, and are made of, for example, Ti (titanium) or Al (aluminum).

Figure 3A:
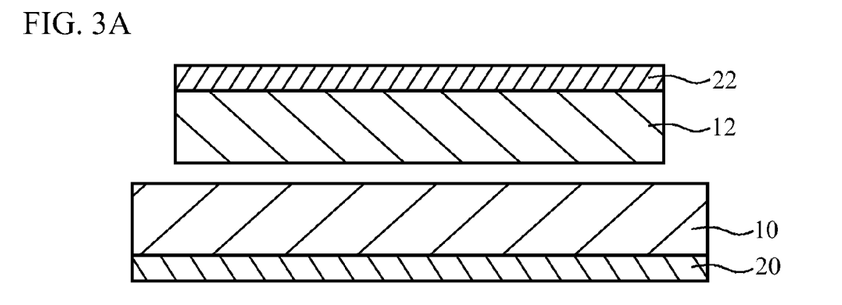
FIGS. 3A to 3E are sectional views of a method for producing the acoustic wave device according to the first embodiment.
Figure 3B:
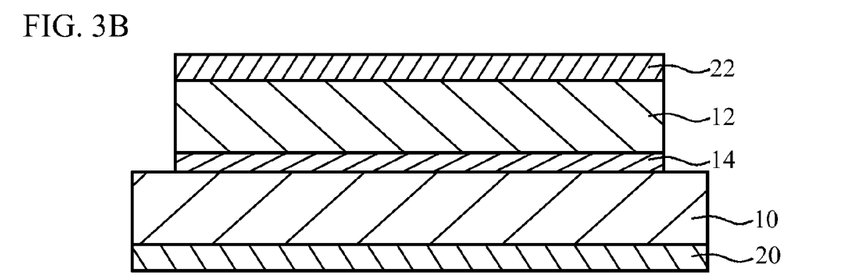
Figure 4:
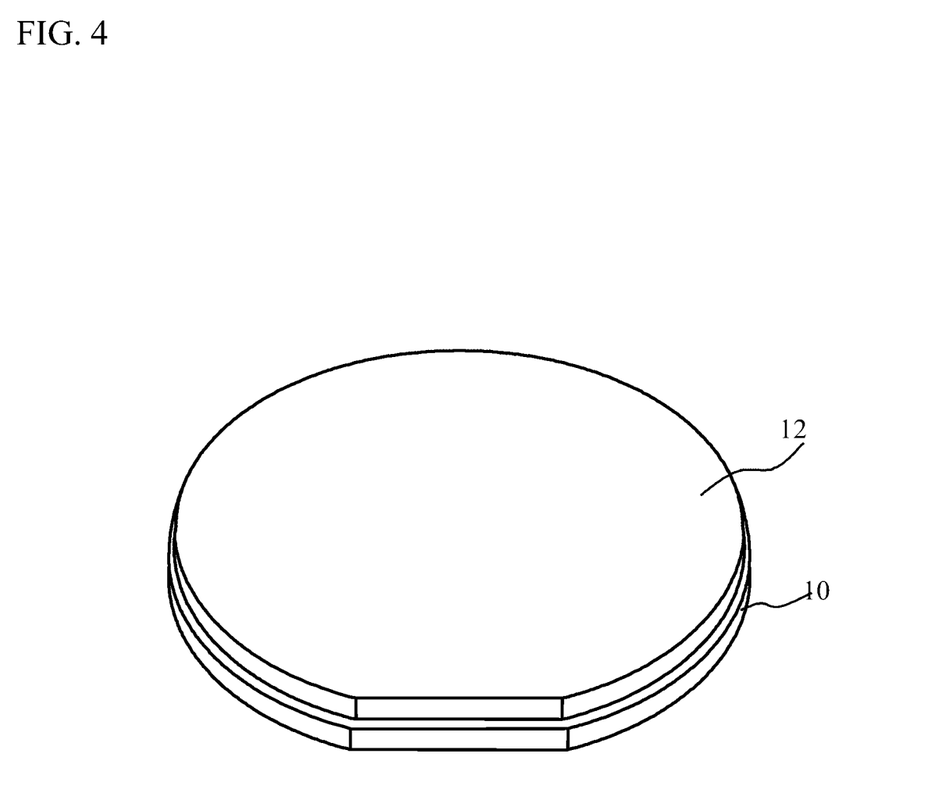
FIG. 4 is a perspective view of the element substrate bonded on the supporting substrate.

Next, the lower surface of the supporting substrate 10 and the upper surface of the element substrate 12 are bonded together at room temperature (see FIG. 3B). The supporting substrate 10 and the element substrate 12 are bonded together at room temperature so as to interpose the amorphous layer 14. For example, the amorphous layer 14 has a thickness of 1 nm to 8 nm. FIG. 4 illustrates appearances of the supporting substrate 10 and the element substrate 12 integrated with each other by room temperature bonding.

Figure 3C:
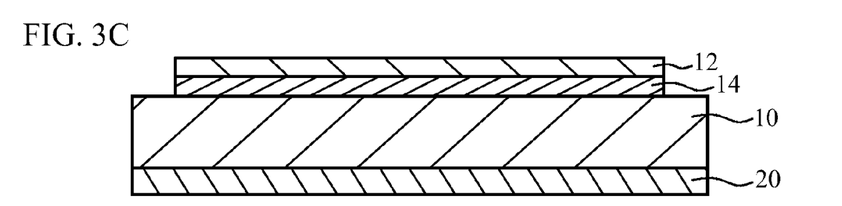

Subsequently, the metal film 22 arranged on the upper surface of the element substrate 12 is removed, and the element substrate 12 is then polished to realize a given thickness of the element substrate 12 (see FIG. 3C).

Figure 3D:
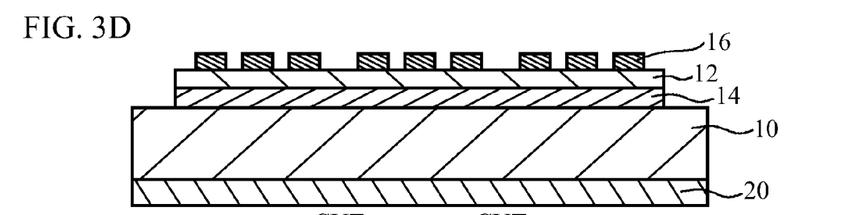

The IDT 17a and the reflection electrodes 17b formed by the patterned metal layer 16 are formed on the upper surface of the element substrate 12 by a deposition technique such as sputtering or vapor deposition and by a patterning technique such as photo-etching (see FIG. 3D). For example, the metal layer 16 is mainly made of Al (aluminum), and may include Cu (copper). Instead, lift-off may be used to form the IDT 17a and the reflection electrode 17b.

Figure 3E:
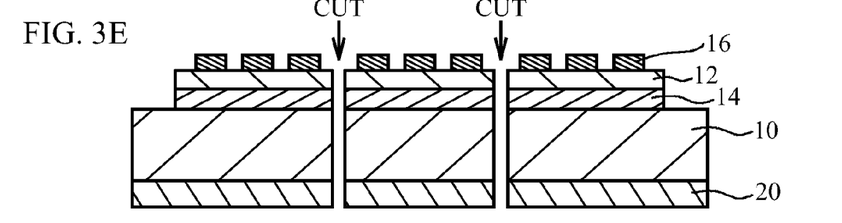

Subsequently, the element substrate 12 and the supporting substrate 10 integrated together is cut by dicing to be separated into acoustic wave devices (see FIG. 3E). The element substrate 12 and the supporting substrate 10 are cut continuously by the same dicing blade, since the substrates are made of the same materials. In contrast, if the element substrate is bonded to the supporting substrate made of a different material having a thermal expansion coefficient for suppressing the thermal expansion of the element substrate, it is required to cut the element substrate and the supporting substrate separately by performing dicing twice with different dicing blades in a case where the supporting substrate is made of sapphire having a high hardness. This may cause a problem that a step is formed on a side wall of a chip and an area thereof cannot be reduced. In contrast, the first embodiment is capable of continuously cutting the two substrates with the same dicing blade to form individual chips. Thus, no step is formed on the side walls of the chip, and the chip area may be reduced.

A description will be given of the room temperature bonding between the supporting substrate 10 and the element substrate 12. Before the room temperature bonding, a pretreatment is performed in order to remove dusts and particles on bonded surfaces. For example, the pretreatment includes a scrubbing process (a surface treatment with a brush) and a megasonic (ultrasonic) cleaning process.

The supporting substrate 10 and the element substrate 12 subjected to the pretreatment are arranged to face each other with being spaced sufficiently apart from each other in a treatment apparatus (see FIG. 5A) FIGS. 5A to 6B schematically illustrate molecules, represented by reference numeral 26, of materials included in the substrates.

Figure 5A:
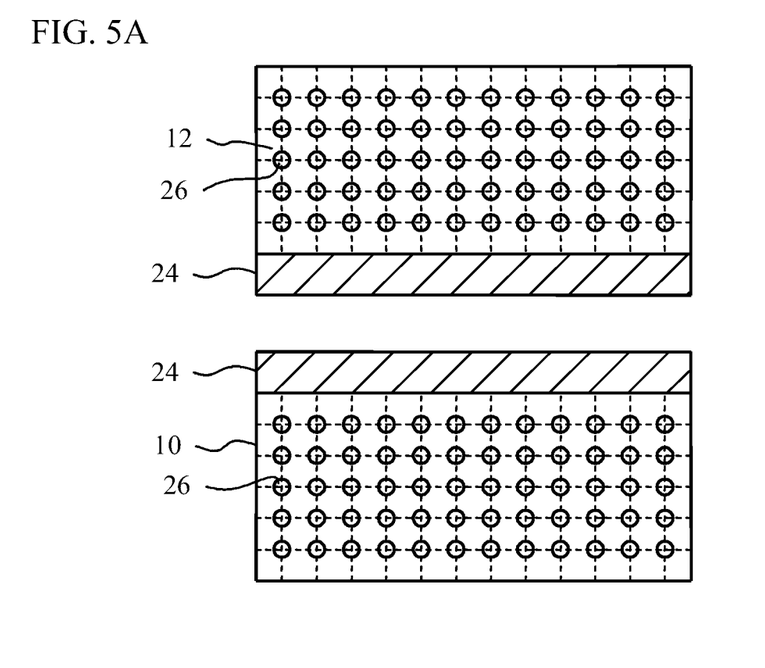
FIGS. 5A and 5B are explanatory views of a method for bonding the element substrate on the supporting substrate.
Figure 5B:
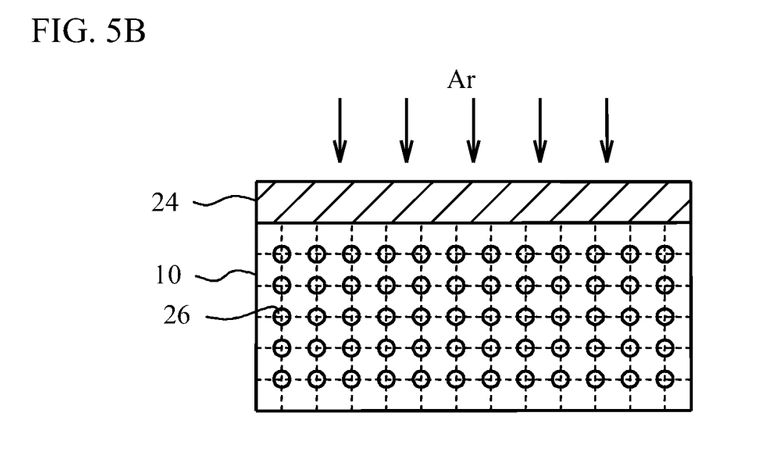

In this state, an ion beam, a neutral beam, or plasma of an inert gas is irradiated onto the upper surface (bonded surface) of the supporting substrate 10 and the lower surface (bonded surface) of the element substrate 12 (see FIG. 5B). FIG. 5B illustrates an irradiation state of the supporting substrate 10, the element substrate 12 being also irradiated at the same time. This process removes surface layers 24 (oxide layers or the like) on the upper surface of the supporting substrate 10 and the lower surface of the element substrate 12, and activates these surfaces.

As means of a surface activation, Ar (argon) gas may be used as the inert gas, and argon ions are irradiated onto the upper surface of the supporting substrate 10 and the lower surface of the element substrate 12. The followings are examples of the irradiation condition of the argon ions in a depressurized state.

Figure 6A:
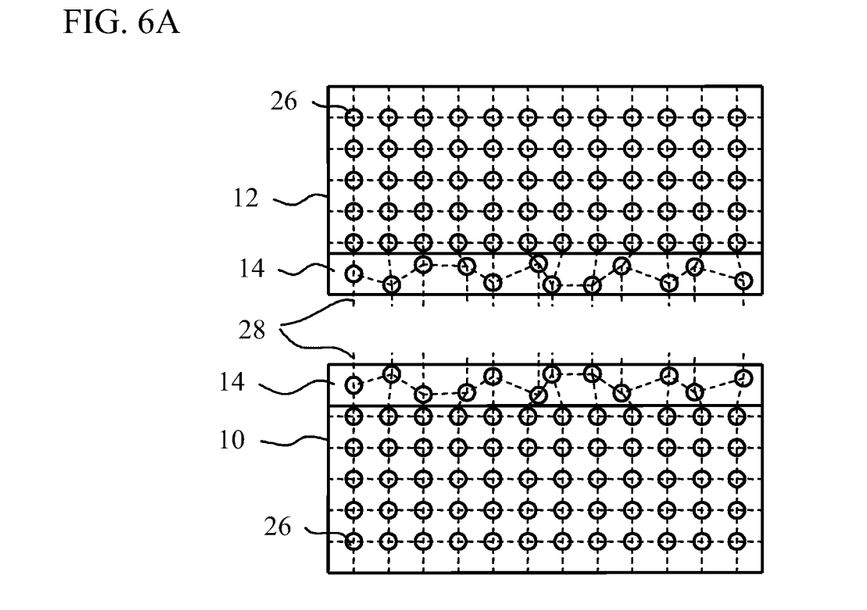
FIGS. 6A and 6B are explanatory views of the method for bonding the element substrate on the supporting substrate.

Ar gas flow rate: 20 to 30 sccm
Current value: 15 to 150 mA
Irradiation time: 30 to 120 seconds The activation treatment forms amorphous layers 14 on the upper surface of the supporting substrate 10 and the lower surface of the element substrate 12, respectively (see FIG. 6A). The amorphous layer 14 has a thickness of several nanometers or less, and uncoupled hands 28 are formed on the surface thereof. The uncoupled hands 28 activate the upper surface of the supporting substrate 10 and the lower surface of the element substrate 12.

Figure 6B:
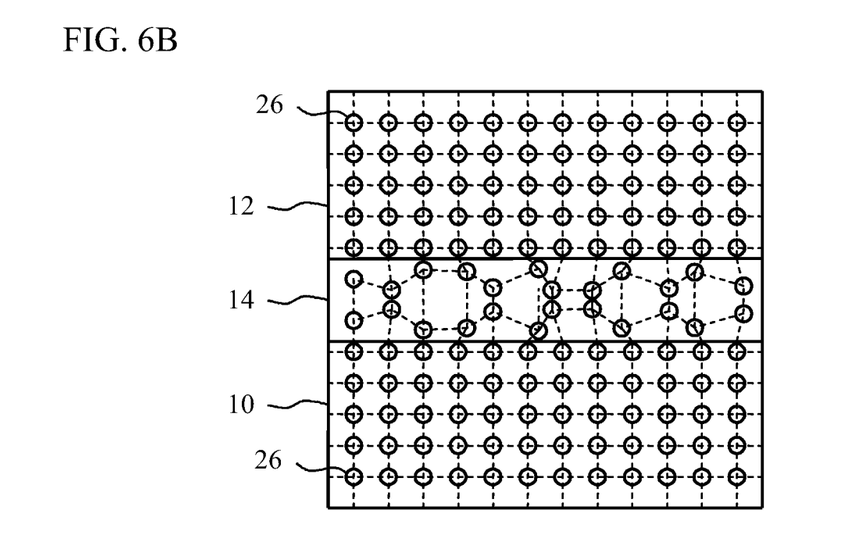

Under the condition that the bonding surfaces have been activated, the upper surface of the supporting substrate 10 and the lower surface of the element substrate 12 face each other to be pasted together to be bonded thereto (see FIG. 6B). The bonding treatment is performed in the apparatus where the irradiation treatment of the inert gas is performed. At this time, the activation of the upper surface of the supporting substrate 10 and the lower surface of the element substrate 12 enables uncoupled hands 28 of the upper surface of the supporting substrate 10 and the lower surface of the element substrate 12 to be combined with each other. That is, the supporting substrate 10 and the element substrate 12 are bonded together at room temperature, for example, at 100° C. or less. The amorphous layers 14 are interposed between the supporting substrate 10 and the element substrate 12 in an integrated manner. The integrated amorphous layer 14 has a thickness of 1 nm to 8 nm.

In the first embodiment, the supporting substrate 10 and the element substrate 12 are lithium tantalate substrates. Both substrates are made of the same material, so the densities thereof are the same. The acoustic velocity in the supporting substrate 10 is substantially the same as that in the element substrate 12. The amorphous layer 14 is made of lithium tantalate, which is the same as the materials of the supporting substrate 10 and the element substrate 12, and has the same density. Only the difference between the amorphous layer 14 and the substrates 10 and 12 is a crystal structure. Therefore, the amorphous layer 14 has an acoustic velocity identical to those in the substrates 10 and 12. As mentioned above, the acoustic impedance depends on the acoustic velocity and the substrate density. Thus, there is little difference in acoustic impedance between the supporting substrate 10 and the element substrate 12. It is therefore difficult for a bulk wave to be reflected on an boundary between the supporting substrate 10 and the element substrate 12, and it is possible to suppress the generation of spurious.

In the crystal orientation of lithium tantalate, the linear thermal expansion coefficient in the X-axis direction is the largest, and the linear thermal expansion coefficient in the Z-axis direction is the smallest. Each linear thermal expansion coefficient in the X-axis direction and the Y-axis direction is 16.1 ppm/° C., and the linear thermal expansion coefficient in the Z-axis is 4.1 ppm/° C.

As described above, the propagation direction of the acoustic wave in the element substrate 12 is set to be the X-axis direction in consideration of performance of the acoustic surface wave element. In contrast, the normal direction of the upper surface of the supporting substrate 10 is the X-axis or Y-axis direction. This makes it possible to make the liner thermal expansion coefficient of the supporting substrate 10 in a direction parallel to the X-axis of the element substrate 12 lower than that of the supporting substrate 10 in the X-axis thereof. Therefore, bonding the element substrate 12 on the supporting substrate 10 reduces the temperature dependence of the acoustic surface wave element formed on the element substrate 12. Even when the propagation direction of the element substrate 12 is misaligned by about ±2~3° with respect to the X-axis direction, the propagation direction is regarded to be substantially the same as the X-axis direction. Also, even when the normal direction of the upper surface of the supporting substrate 10 is misaligned by about ±2~3° with respect to the X-axis or Y-axis direction, such a small misalignment is allowed and the normal direction is regarded to be substantially the same as the X-axis or the Y-axis.

In the first embodiment, the propagation direction of the acoustic wave of the element substrate 12 is not parallel to the Z-axis of the supporting substrate 10. This arrangement eliminates the spurious response. Further, the arrangement makes it possible to reduce the difference in linear thermal expansion coefficient between the element substrate 12 in the propagation direction (X-axis direction) of the acoustic wave and the supporting substrate 10 in the direction parallel to the propagation direction of the acoustic wave. It is thus possible to suppress the substrates from being deformed.

The first embodiment sets the difference in linear thermal expansion coefficient between the element substrate 12 in the propagation direction of the acoustic wave and the supporting substrate 10 in the direction parallel to the propagation direction of the acoustic wave so as to suppress the temperature dependence of the acoustic surface wave element and the deformation of the substrates resulted from the heat treatment. This setting makes it possible to suppress the temperature dependence of the acoustic surface wave element, and the deformation of the substrates resulted from the heat treatment.

In the first embodiment, the amorphous layers 14 are formed on the upper surface of the supporting substrate 10 and the lower surface of the element substrate 12, and the supporting substrate 10 and the element substrate 12 are bonded together while the amorphous layers 14 have been activated. The activated amorphous layers 14 lead to a strong bonding of the supporting substrate 10 and the element substrate 12 at a comparatively low temperature. That is, a so-called room temperature bonding is realized in such a manner that the lower surface of the element substrate 12 and the upper surface of the supporting substrate 10 are bonded together at a temperature of 100° C. or less. It is therefore possible to strongly bond the substrates 10 and 12 without generating the thermal stress on the bonding surfaces of the substrates.

The linear thermal expansion coefficients in the X-axis and Y-axis directions are the same as each other. It is therefore preferable that the propagation direction of the acoustic wave should not be parallel to the Y-axis of the supporting substrate. Thus, the temperature dependence of the surface acoustic wave element can be suppressed.

Although the normal direction of the upper surface of element substrate 12 may be any direction, it is preferable that the normal direction of the upper surface of the element substrate 12 should be rotated by 36° to 48° from the Y-axis toward the Z-axis with the X-axis being set as a center in order to improve the performance of the acoustic wave device.

It is also preferable that the supporting substrate 10 having the linear thermal expansion coefficient in the direction parallel to the propagation direction of the acoustic wave should be smaller than that of the element substrate 12 in the X-axis direction thereof. This results in further suppressing the temperature dependence of the acoustic wave device.

Preferably, the element substrate 12 is thinner than the supporting substrate 10. This enables suppression of the temperature dependence of the operating frequency (TCF) of the acoustic wave element.

Second Embodiment

Figure 7:
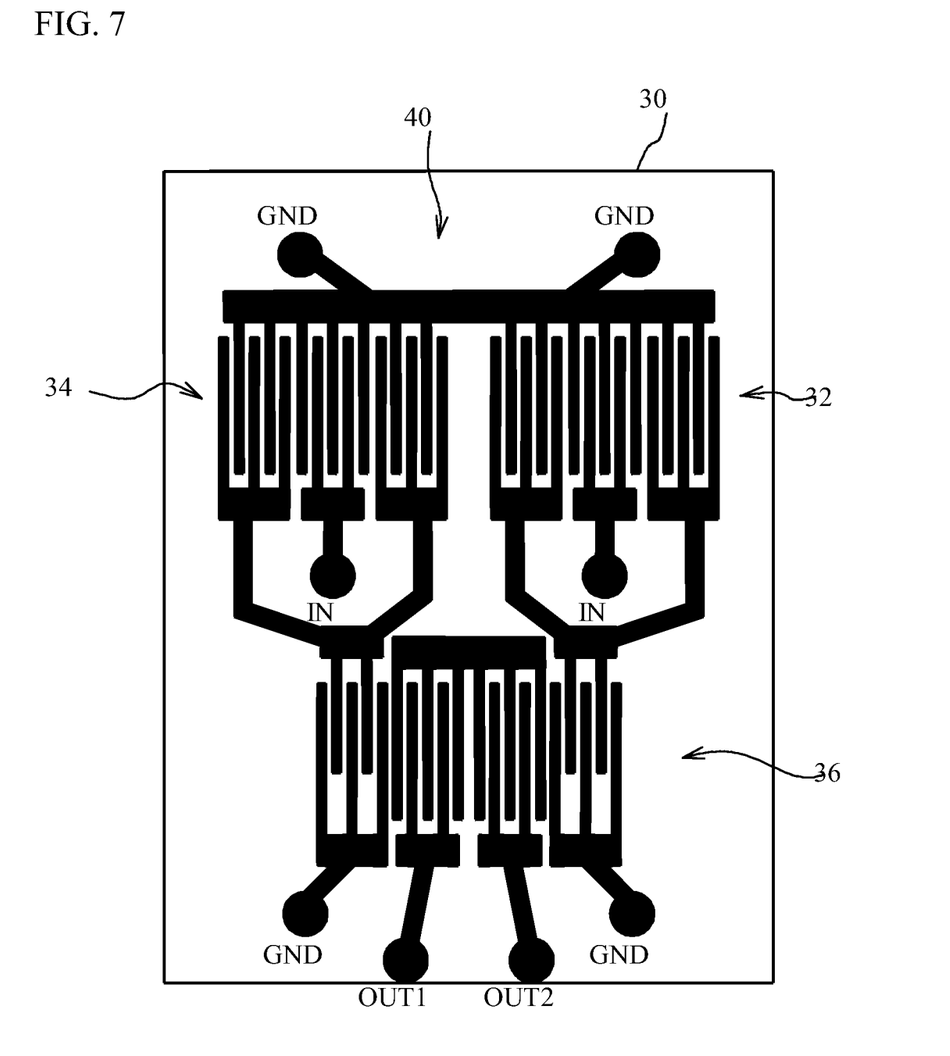
FIG. 7 is a plan view of a structure of the acoustic wave device according to a second embodiment.

FIG. 7 illustrates an exemplary acoustic wave device according to a second embodiment to which the structure and the production method described in the first embodiment are applied. Some electrode fingers (IDT) are omitted in FIG. 7 for the sake of simplicity. In the acoustic wave device illustrated in FIG. 7, a multimode acoustic wave filter 40 is formed on a substrate 30. The multimode acoustic wave filter 40 includes input filters 32 and 34 each having three IDTs, and an output filter 36 having four IDTs. Input terminals INs are respectively provided at the IDTs located at the centers of the input filters 32 and 34. Unbalanced input signals are input to the input terminals INs. The IDTs respectively located at both sides of the input filter 32 are connected to the IDT arranged at one side of the output filter 36, and the IDTs located at both sides of the input filter 34 are connected to the IDT arranged at the other side of the output filter 36. The input filters 32 and 34 output balanced signals. Output terminals OUT1 and OUT2 are provided at two IDTs located at the center of the output filter 36, respectively. The output terminals OUT1 and OUT2 are used to output balanced output signals. The input filters 32 and 34 may output unbalanced signals, while the output filter 36 may generate balanced signals.

Four samples are made as the acoustic wave devices having structures illustrated in FIG. 7. As for the four samples, the substrates 30 have different structures as follows. Specifically, a sample A has a 42 degrees Y-cut X-propagation lithium tantalate substrate having a thickness of 300 µm as the substrate 30. Samples B to D each have the substrate 30 composed of the supporting substrate 10 described in the first embodiment, and the element substrate 12 arranged thereon and made of a material different from that of the supporting substrate 10. Specifically, the sample B has the supporting substrate 10 that is a sapphire substrate having a thickness of 270 µm, and the element substrate 12 that is a 42 degrees Y-cut X-propagation lithium tantalate substrate having a thickness of 40 µm. The sample C has the supporting substrate 10 that is a X-cut 112 degrees Y-propagation lithium tantalate substrate having a thickness of 300 µm, and the element substrate 12 that is bonded thereto and is a 42 degrees Y-cut X-propagation having a thickness of 15 µm. The sample D has the supporting substrate 10 that is an X-cut 112 degrees Y-propagation lithium tantalate substrate having a thickness of 300 µm, and the element substrate 12 that is bonded thereto and is a 42 degrees Y-cut X-propagating having a thickness of 25 µm. The condition that Ar (argon) ions are irradiated in the room temperature bonding process in forming the samples C and D is selected from the conditions previously described in the first embodiment.

Figure 8A:
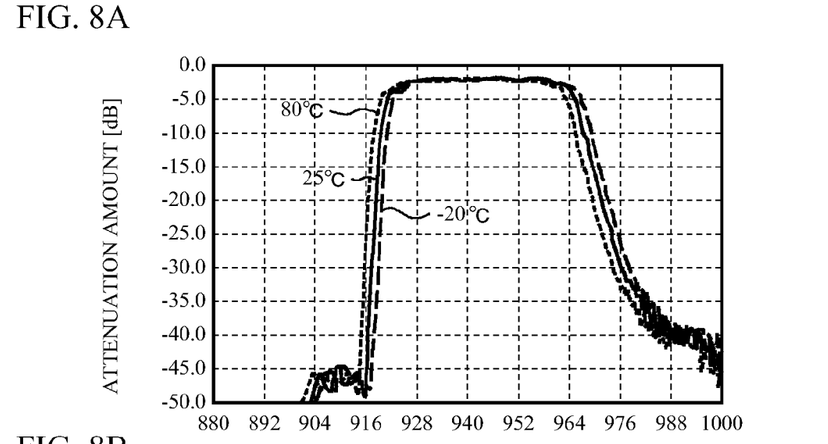
FIG. 8A is a graph of a passband characteristic of a sample A.
Figure 8B:
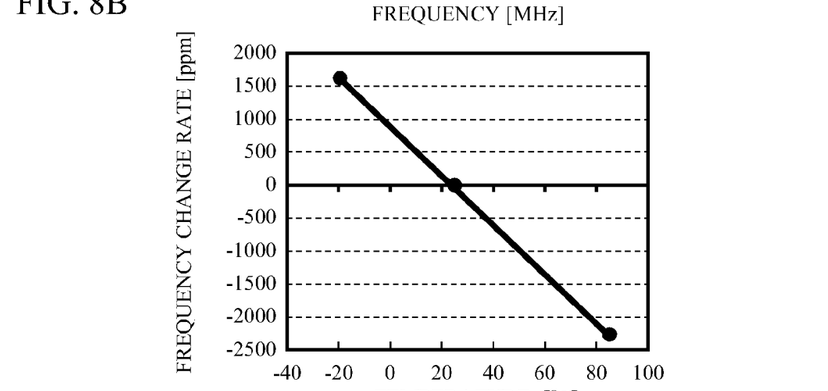
FIGS. 8B and 8C are graphs of temperature dependences of frequency change rates at a high frequency end and a low frequency end of the passband, respectively.
Figure 8C:
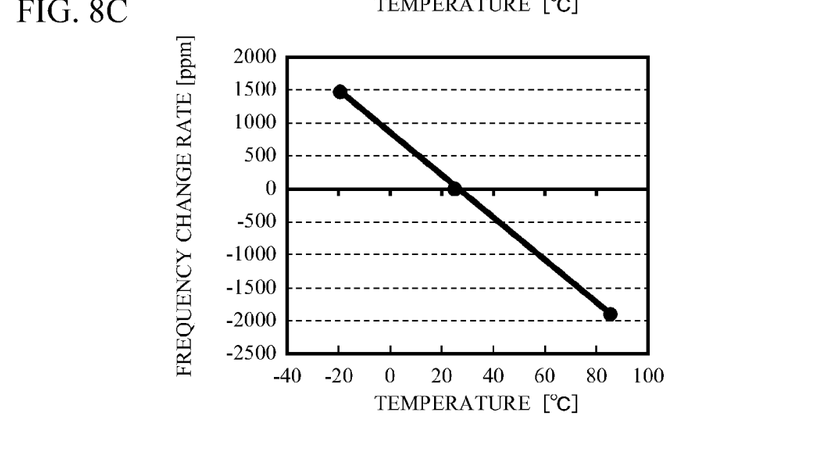

FIGS. 8A through 8C illustrate a passband characteristic of the sample A. In FIG. 8A, a broken line indicates a passband characteristic at −20° C., a solid line indicates a passband characteristic at 25° C., and a dashed line indicates a passband characteristic at 80° C. In FIGS. 8B and 8C, the high and low frequency ends of the passband are frequencies having attenuation of −20 dB. A frequency change rate is set to be zero at 25° C. These conditions apply to FIGS. 9A to 11C as will be described later. Referring to FIG. 8A, a spurious response is not observed in the passband of the sample A. It is seen from FIGS. 8B and 8C that the temperature coefficients at the high and low frequency ends are −37.0 and −32.2 ppm/° C., respectively.

Figure 9A:
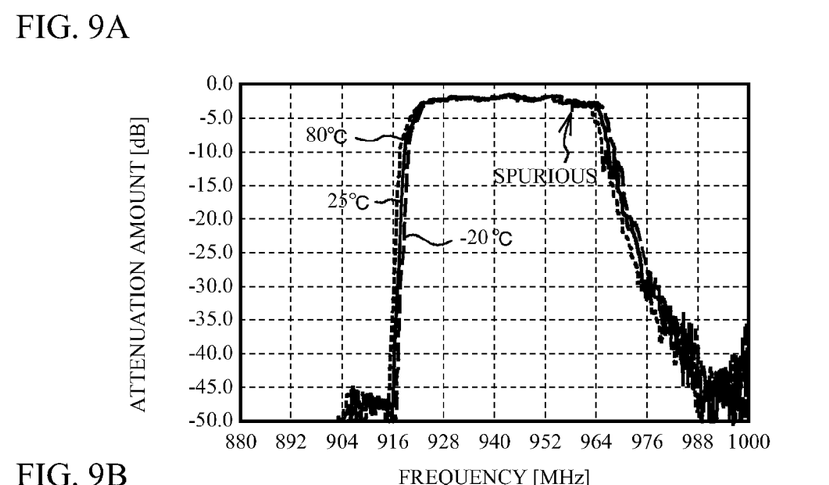
FIG. 9A is a graph of a passband characteristic of a sample B.
Figure 9B:
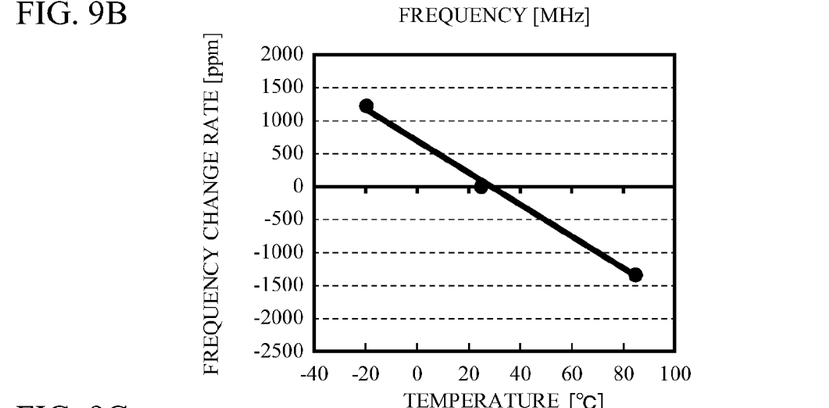
FIGS. 9B and 9C are graphs of temperature dependences of frequency change rates of a high frequency end and a low frequency end of the passband, respectively.
Figure 9C:
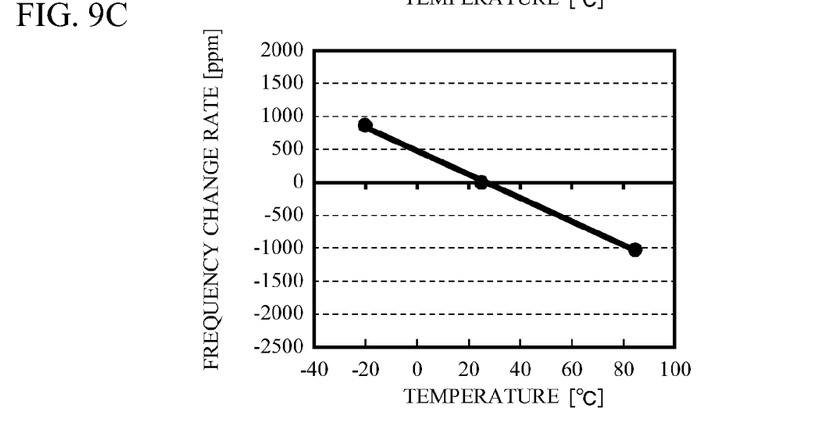

FIGS. 9A and 9B illustrate a passband characteristic of the sample B. Referring to FIG. 9A, a spurious response is observed in the passband of the sample B. It is seen from FIGS. 9B and 9C that the temperature coefficients of the high and low frequency ends are −24.5 and −17.9 ppm/° C., respectively.

Figure 10A:
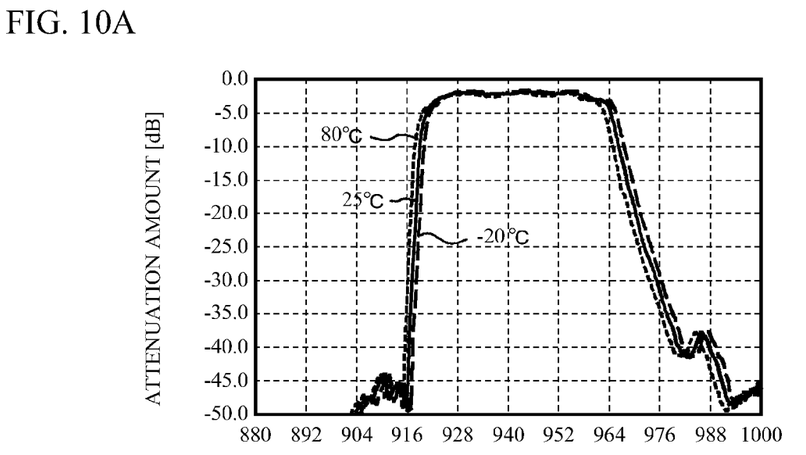
FIG. 10A is a graph of a passband characteristic of a sample C.
Figure 10B:
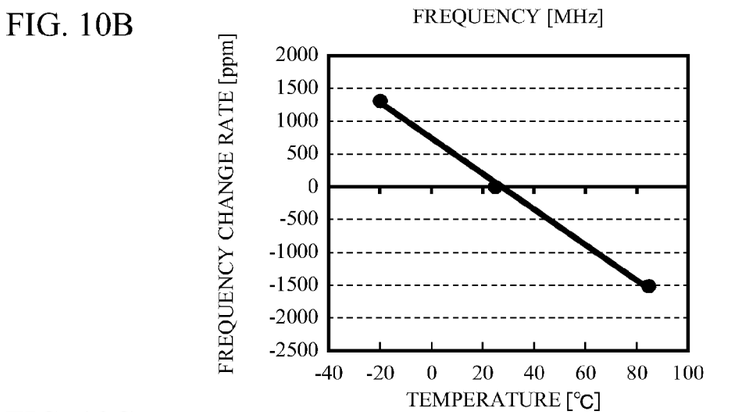
FIGS. 10B and 10C are graphs of temperature dependences of frequency change rates of the high frequency end and the low frequency end of the passband, respectively.
Figure 10C:
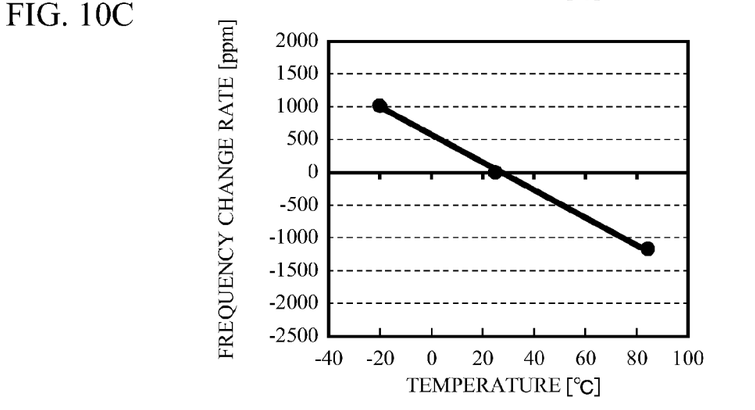

FIGS. 10A through 10C illustrate a passband characteristic of the sample C. As illustrated in FIG. 10A, a spurious response is not observed in the passband of the sample C. It is seen from FIGS. 10B and 10C that the temperature coefficients of the high and low frequency ends are −26.9 and −20.8 ppm/° C., respectively.

Figure 11A:
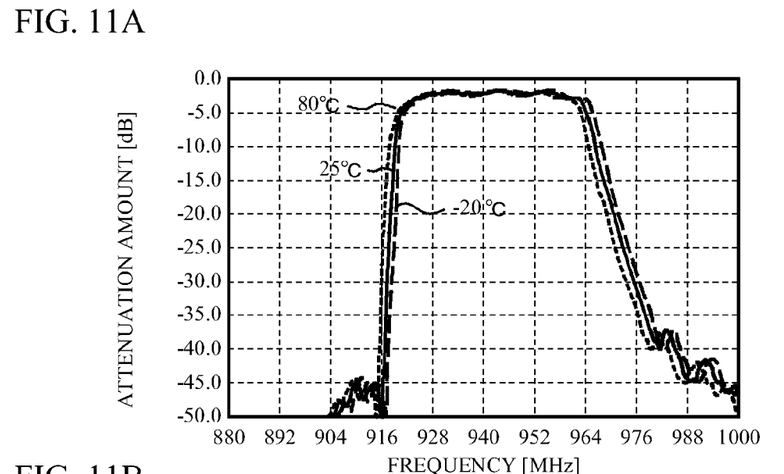
FIG. 11A is a graph of a passband characteristic of a sample D.
Figure 11B:
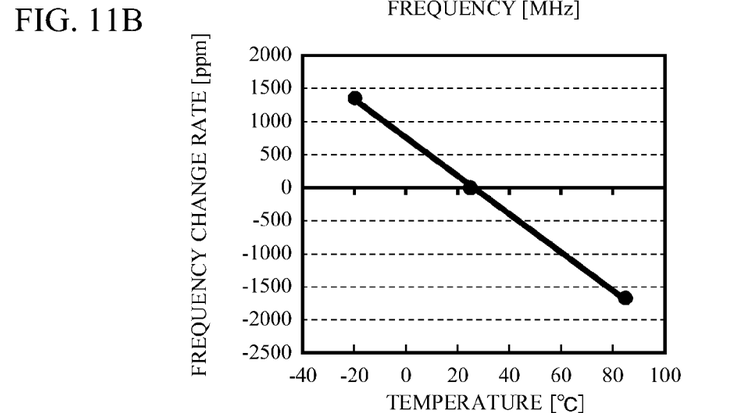
FIGS. 11B and 11C are graphs of temperature dependences of frequency change rates of the high frequency end and the low frequency end of the passband, respectively.
Figure 11C:
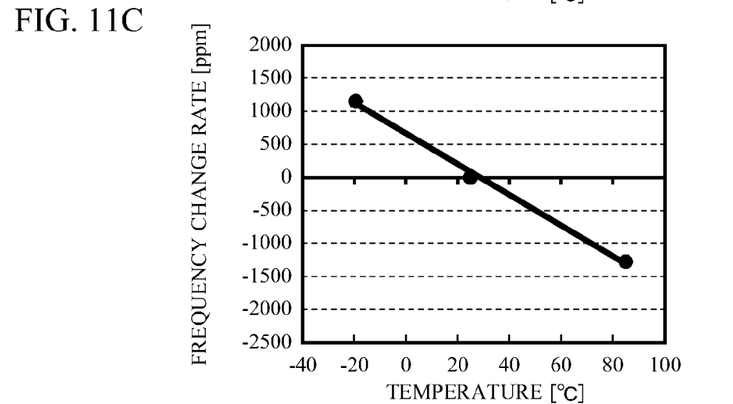

FIGS. 11A through 11C illustrate a passband characteristic of the sample D. Referring now to FIG. 11A, a spurious response is not observed in the passband of the sample D. It is seen from FIGS. 11B and 11C that the temperature coefficients of the high and low frequency ends are −28.6 and −23.0 ppm/° C., respectively.

Table 1 illustrates characteristics of the samples A to D.

TABLE 1

|  | SPURIOUS | LOW FREQUENCY END | HIGH FREQUENCY END |
| --- | --- | --- | --- |
| SAMPLE A | NON-OCCURRENCE | −32.2 ppm/° C. | −37.0 ppm/° C. |
| SAMPLE B | OCCURRENCE | −17.9 ppm/° C. | −24.5 ppm/° C. |
| SAMPLE C | NON-OCCURRENCE | −20.8 ppm/° C. | −26.9 ppm/° C. |
| SAMPLE D | NON-OCCURRENCE | −23.0 ppm/° C. | −28.6 ppm/° C. |

It is seen from Table 1 that the temperature dependence of the passband ends of the sample B having the lithium tantalate substrate arranged on the sapphire substrate is closer to zero than that of the sample A having the single lithium tantalate substrate as the substrate 30. However, a spurious response occurs within the passband resulting from a bulk wave (see FIG. 9A).

In contrast, referring to the sample C or D in which the element substrate made of lithium tantalate is arranged on the supporting substrate made of lithium tantalate, the temperature dependence of the sample C or D is slightly worse than that of the sample B, but spurious resulting from the bulk wave does not occur within the passband. The absolute value of the temperature coefficient of the sample C or D at the passband end is smaller than that of the sample A.

As comparing the sample C with the sample D, the temperature coefficient at the passband end to be closer to zero as the element substrate becomes thinner.

As described above, the samples C and D, in which the element substrate made of lithium tantalate is arranged on the supporting substrate made of lithium tantalate, makes it possible to suppress the spurious response caused by the bulk wave and to make the temperature coefficient of the frequency closer to zero. Further, a reduction in the thickness of the element substrate 12 makes the temperature coefficient of the frequency closer to zero. Additionally, the element substrate 12 can be made thinner than the supporting substrate 10, specifically, the thickness of the element substrate 12 can be made $1/20$ to $1/10$ of the thickness of the supporting substrate 10.

Third Embodiment

Figure 12:
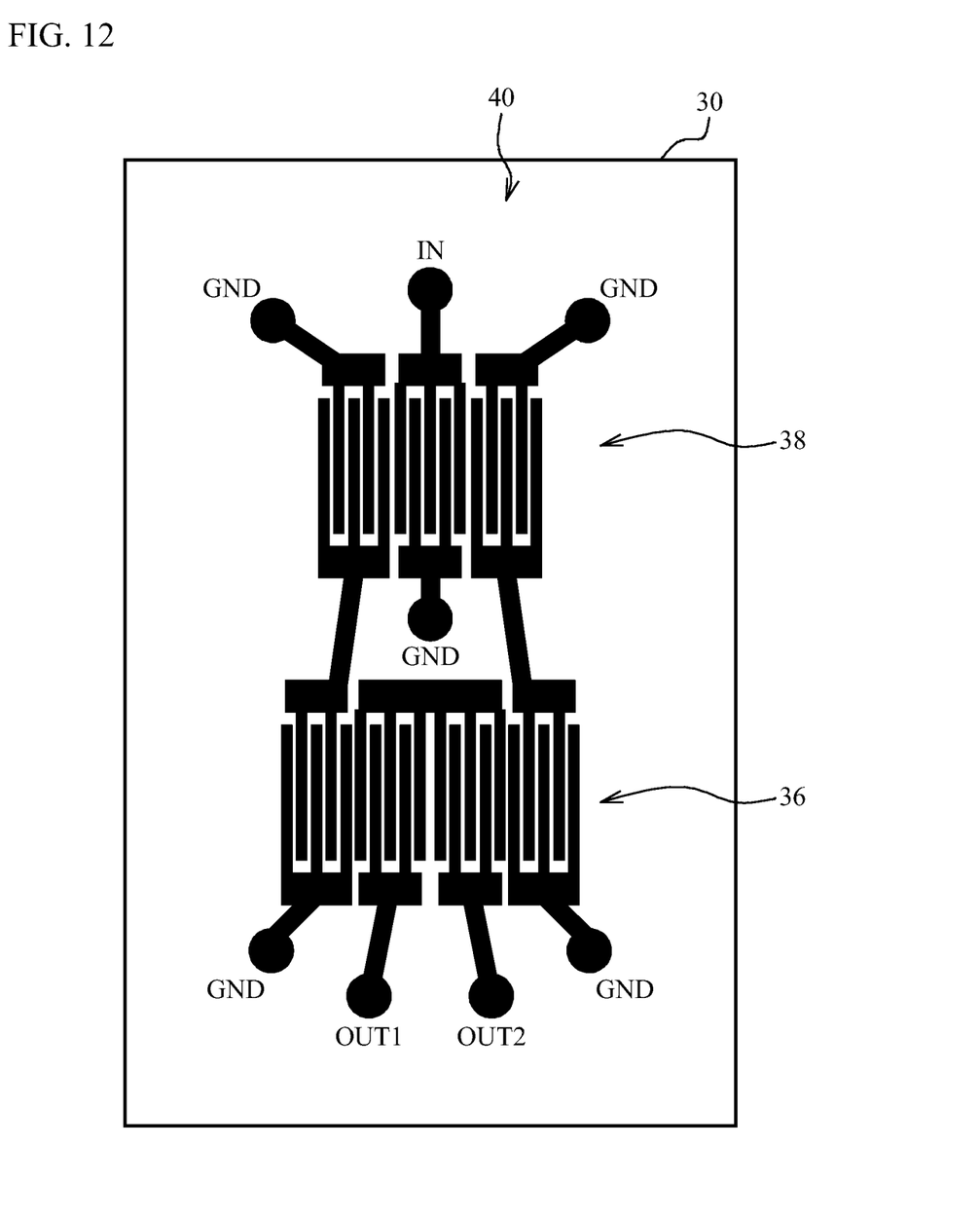
FIG. 12 is a plan view of an acoustic wave device according to a third embodiment.

FIG. 12 illustrates an acoustic wave device according to a third embodiment to which the structure and the production method described in the first embodiment are applied. Referring to FIG. 12, the acoustic wave filter 40 includes an input filter 38 having three IDTs, and the output filter 36 having four IDTs. The input terminal IN is provided at the IDT located at the center of the input filter 38. An unbalanced signal is input to the input terminal IN. The IDTs located at both sides of the input filter 38 are respectively connected to the IDTs located at both sides of the output filter 36. The output terminals OUT1 and OUT2 are provided at two IDTs located near the center of the output filter 36, respectively. The output terminals OUT1 and OUT2 are used to output the balanced signals.

As mentioned above, the acoustic wave device may be a filter having a combination of a plurality of multi-mode filters. The acoustic wave device may be a single multi-mode filter. The acoustic wave device may be a ladder filter. The acoustic wave device may be a resonance element. The acoustic wave device may be one other than the acoustic surface wave device.

The embodiments of the present invention have been described. The present invention is not limited to these specific embodiments but may be varied or changed within the scope of the claimed invention.

What is claimed is:

1. An acoustic wave device comprising:
   a supporting substrate made of lithium tantalate;
   an element substrate made of lithium tantalate, and having a lower surface bonded to and arranged on an upper surface of the supporting substrate; and
   a comb-like electrode formed on an upper surface of the element substrate and exciting an acoustic wave,
   wherein a propagation direction of the acoustic wave in the element substrate is parallel to an X-axis of a crystal orientation in the element substrate,
   a normal direction of the upper surface of the supporting substrate is parallel to an X-axis or a Y-axis of a crystal orientation in the supporting substrate, and
   the propagation direction of the acoustic wave is not parallel to any of a Z-axis, the X-axis, and the Y-axis of the crystal orientation in the supporting substrate.

2. The acoustic wave device of claim 1, further comprising an amorphous layer interposed between the upper surface of the supporting substrate and the lower surface of the element substrate.

3. The acoustic wave device of claim 1, wherein the lower surface of the element substrate and the upper surface of the supporting substrate are bonded together at room temperature.

4. The acoustic wave device of claim 1, wherein a normal direction of the upper surface of the element substrate is parallel to a direction rotated by 36 degrees to 48 degrees from the Y-axis of the crystal orientation in the element substrate toward the Z-axis of the crystal orientation in the element substrate with the X-axis of the crystal orientation in the element substrate set as a center.

5. The acoustic wave device of claim 1, wherein a linear thermal expansion coefficient of the supporting substrate in a direction parallel to the propagation direction of the acoustic wave is smaller than a linear thermal expansion coefficient of the supporting substrate in a direction the X-axis of the crystal orientation in the supporting substrate.

6. The acoustic wave device of claim 1, wherein the element substrate is thinner than the supporting substrate.

7. The acoustic wave device of claim 1, wherein the supporting substrate and the element substrate form a side wall not having a step.

* * * * *